(12) United States Patent
Kim

(10) Patent No.: US 12,547,199 B2
(45) Date of Patent: Feb. 10, 2026

(54) SEMICONDUCTOR DEVICE

(71) Applicant: SAMSUNG ELECTRONICS CO., LTD., Suwon-si (KR)

(72) Inventor: Hyochang Kim, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 898 days.

(21) Appl. No.: 17/852,031

(22) Filed: Jun. 28, 2022

(65) Prior Publication Data

US 2023/0178543 A1 Jun. 8, 2023

(30) Foreign Application Priority Data

Dec. 3, 2021 (KR) .................. 10-2021-0172134
Mar. 31, 2022 (KR) .................. 10-2022-0040522

(51) Int. Cl.
*G05F 3/26* (2006.01)
*G05F 3/24* (2006.01)
*H03L 1/02* (2006.01)

(52) U.S. Cl.
CPC ............. *G05F 3/262* (2013.01); *G05F 3/245* (2013.01); *H03L 1/022* (2013.01)

(58) Field of Classification Search
CPC ........... G05F 3/245; G05F 3/262; H03L 1/022
See application file for complete search history.

(56) References Cited

U.S. PATENT DOCUMENTS

| | | | | |
|---|---|---|---|---|
| 5,391,979 | A | * | 2/1995 | Kajimoto .................. G05F 3/30 327/543 |
| 6,111,533 | A | * | 8/2000 | Yuan .................. H03M 1/0621 341/157 |
| 6,275,100 | B1 | | 8/2001 | Park et al. |
| 7,301,322 | B2 | | 11/2007 | Choi |
| 7,944,271 | B2 | | 5/2011 | Illegems |
| 9,466,986 | B2 | | 10/2016 | Kwon et al. |
| 2004/0160350 | A1 | * | 8/2004 | Lu ......................... H03M 1/808 341/154 |
| 2006/0103454 | A1 | | 5/2006 | Lyon |
| 2010/0259315 | A1 | | 10/2010 | Lin |
| 2021/0263547 | A1 | | 8/2021 | Shen et al. |

FOREIGN PATENT DOCUMENTS

| | | |
|---|---|---|
| JP | 2004-015423 A | 1/2004 |
| KR | 10-0607164 A | 4/2001 |

* cited by examiner

*Primary Examiner* — Jue Zhang
(74) *Attorney, Agent, or Firm* — Fish & Richardson P.C.

(57) ABSTRACT

A semiconductor device includes; a resistor element connected to a first power supply node providing a first power supply voltage having a first magnitude, a PMOS transistor having a gate terminal connected to a second power supply node providing a second power supply voltage having a second magnitude less than the first magnitude, a source terminal connected to the resistor element, and a drain terminal providing a first current, and a first NMOS transistor configured as a diode-connected transistor, and connected between the drain terminal of the PMOS transistor and the second power supply node.

20 Claims, 7 Drawing Sheets

SEMICONDUCTOR DEVICE

CROSS-REFERENCE TO RELATED APPLICATION(S)

This U.S. nonprovisional application claims benefit of priority under 35 U.S.C. § 119 to Korean Patent Application No. 10-2021-0172134 filed on Dec. 3, 2021 and Korean Patent Application No. 10-2022-0040522 filed on Mar. 31, 2022, the collective subject matter of which is hereby incorporated by reference in its entirety.

BACKGROUND

The inventive concept relates generally to semiconductor devices including a current source that provides a constant current regardless of temperature change.

Semiconductor devices may be incorporated within a variety electronic devices, such as personal computers (PCs), smartphones, tablet PCs, etc. Some semiconductor devices may include a current source configured to provide electrical current. Characteristics of the output current may vary in accordance with a number of factors, both internal and external to the semiconductor device. For example, a current output provided by a current source may be greatly affected by variations in temperature.

However, a temperature-variable output current is usually undesirable, since it may cause variations in the performance of the semiconductor device. Accordingly, in order to maintain stable performance of the semiconductor device over a range of temperatures, it is desirable to provide a constant output current that does not materially vary with temperature.

SUMMARY

Embodiments of the inventive concept provide semiconductor devices including a current source capable of providing a constant output current over a range of temperatures es without recourse to a bandgap reference circuit. Accordingly, semiconductor devices according to embodiments of the inventive concept may be implemented in a relatively less area, thereby improving integration density and performance.

According to an embodiment of the inventive concept, a semiconductor device may include; a resistor element connected to a first power supply node providing a first power supply voltage having a first magnitude, a PMOS transistor having a gate terminal connected to a second power supply node providing a second power supply voltage having a second magnitude less than the first magnitude, a source terminal connected to the resistor element, and a drain terminal providing a first current, and a first NMOS transistor configured as a diode-connected transistor, and connected between the drain terminal of the PMOS transistor and the second power supply node.

According to an embodiment of the inventive concept, a semiconductor device may include; a cell region including a plurality of memory cells, and a peripheral circuit region including peripheral circuits driving the cell region. The peripheral circuit region may further include a current source including a resistor element, a PMOS transistor, and a diode-connected first NMOS transistor, wherein a control terminal of the PMOS transistor receives a ground voltage, an input terminal of the PMOS transistor receives a power supply voltage higher than the ground voltage through the resistor element, and an output terminal of the PMOS transistor provides a current to the first NMOS transistor.

According to an embodiment of the inventive concept, a semiconductor device may include; a current source configured to provide a constant current regardless of temperature change, and a temperature sensor configured to sense temperature in response to the constant current. The current source may include; a resistor element having a resistance value that varies in proportion to temperature, a PMOS transistor having a threshold voltage that varies inversely in proportion to temperature and including a control terminal connected to an equipotential terminal providing a ground voltage, and a current mirror circuit configured to mirror a current provided by the PMOS transistor.

BRIEF DESCRIPTION OF DRAWINGS

The above and other aspects, features, and advantages of the inventive concept may be more clearly understood upon consideration of the following detailed description together with the accompanying drawings, in which.

DETAILED DESCRIPTION

Throughout the written description and drawings, like reference numbers and labels are used to denote like or similar elements, components, features and/or method steps.

Figure 1:
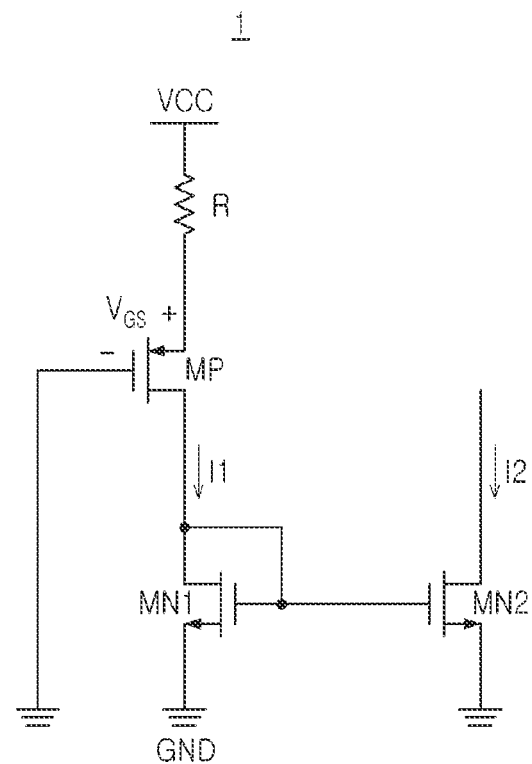
FIG. 1 is a circuit diagram illustrating, in part, a semiconductor device according to embodiments of the inventive concept.

Figure (FIG. 1 is a circuit diagram illustrating, in part, a semiconductor device 1 according embodiments of the inventive concept.

Referring FIG. 1, the semiconductor device 1 may include a resistor element R, a P-type Metal Oxide Semiconductor (MOS) (PMOS) transistor MP, a diode-connected first NMOS transistor MN1, and a second N-type MOS (NMOS) transistor MN2.

One end of the resistor element R may be connected to a first power supply node providing the first power supply voltage VCC. The other end of the resistor element R may be connected to one end of the PMOS transistor MP. A gate terminal of the PMOS transistor MP may be connected to a second power supply node providing the second power supply voltage GND. A magnitude of the second power supply voltage GND may be less than a magnitude of the first power supply voltage VCC.

In some embodiments, the second power supply voltage GND may be configured as a power supply voltage. In response to the second power supply voltage GND input to the gate terminal of the PMOS transistor MP, a gate voltage of the PMOS transistor MP may be maintained at a level less than a source voltage. Accordingly, the PMOS transistor MP may maintain a turned-ON state.

The other end of the PMOS transistor MP may be connected to one end of the first NMOS transistor MN1, and may output a first current I1 which does not substantially change regardless of a temperature change. For example, one end of the PMOS transistor MP may be configured as a source terminal, and the other end may be configured as a drain terminal.

Performance of the semiconductor device 1 may be affected by a number of internal factors and external factors, and may be greatly affected by temperature. For example, a resistance value of the resistor elements included in the semiconductor device 1 may increase as temperature increases, and a threshold voltage of the transistors may decrease as temperature increases. Accordingly, a current output by a current source included in the semiconductor device may change in relation to changes in temperature, and properties (or characteristics) of a circuit operating in response to the output current from the current source may also change in relation to temperature.

For example, the current output by the current source may be input to a current-controlled oscillator. The current-controlled oscillator may output a clock signal determined by the current received from the current source. Accordingly, when the current output by the current source changes in accordance with changing temperature, a frequency of the clock signal output by the current-controlled oscillator may undesirably change, and a changing clock signal frequency may change performance and/or power consumption properties for the semiconductor device. To address potential issue, a current source should be implemented which provides a substantially constant current regardless of temperature change.

Accordingly, in the illustrated example of FIG. 1, the resistance value of the resistor element R may increase in proportion to with temperature, whereas a threshold voltage of the PMOS transistor MP may decrease as temperature increases. That is, the resistance value of the resistor R may have a positive temperature coefficient (PTC), whereas the threshold voltage of the PMOS transistor MP may have a negative temperature coefficient (NTC). Thus, as temperature increases in relation to the circuit of FIG. 1, the resistance value of the resistor element R may increase and the threshold voltage of the PMOS transistor MP may decrease, yet as temperature decreases, the resistance value of the resistor element R may decrease, and the threshold voltage of the PMOS transistor MP may increase.

Referring still to FIG. 1, a first current I1 may flow through the resistor element R, and as described above, a first power supply node providing the first power supply voltage VCC may be connected to one end of the resistor element R. Accordingly, the voltage of the other end of the resistor element R may be expressed as [VCC−I1*R], wherein VCC is the magnitude of the first power supply voltage (here, assumed to be VCC), I1 is the magnitude of the first current I1, and R is a resistance value of the resistor element R.

Since the resistance value of the resistor element R varies in proportion to temperature, as temperature increases, the voltage at the other end of the resistor element R decreases, and as temperature decreases, the voltage at the other end of the resistor element R increases.

A second power supply node providing the second power supply voltage GND may be connected to the gate terminal of the PMOS transistor MP. Accordingly, a constant second power supply voltage GND may be supplied to the gate terminal of the PMOS transistor MP, and the PMOS transistor MP may maintain a turned-ON state.

The other end of the PMOS transistor may be connected to the diode-connected first NMOS transistor MN1, and may output a first current I1. Accordingly, the magnitude of the first current I1 may be expressed by Equation (1) that follows:

$$I1 = \frac{1}{2} * \mu * Cox * \frac{W}{L}(I1 * R - VCC - Vth) \qquad \text{[Equation 1]}$$

Here, 'u' denotes a mobility of carriers for the PMOS transistor MP, 'Cox' denotes the magnitude of the capacitance associated with the gate insulating layer of the PMOS transistor MP, 'L' denotes a channel length for the PMOS transistor MP, 'W' denotes a channel width for the PMOS transistor MP, and 'Vth' denotes the magnitude of the threshold voltage of the PMOS transistor MP.

Referring to Equation 1, since the resistance value of the resistor element R has properties that vary in proportion to temperature, the value of R may increase as temperature increases. Additionally, however, since the threshold voltage of the PMOS transistor MP has properties that vary in inverse proportion to temperature, the Vth value may decrease as temperature increases. Therefore, the value of R which increases as temperature increases, and the value of Vth which decreases as temperature increases, may be used to offset (or cancel out) each other in Equation 1, such that the magnitude of the first current I1 may be constantly maintained regardless of temperature.

It follows that a current source providing a substantially constant output current, regardless of temperature change, may be implemented without a bandgap reference circuit being connected to the gate terminal of the PMOS transistor MP, as is commonly done in certain conventional and comparative examples. As a result, the area (or footprint) required to implement the circuit may be reduced by implementing the current source using the PMOS transistor MP having a gate terminal connected to the second power supply node providing the second power supply voltage GND, instead of using a bandgap reference circuit.

The first NMOS transistor MN1 may be configured as a diode-connected transistor in which a gate terminal and a drain terminal are connected. A gate terminal of the first NMOS transistor MN1 may be connected to a gate terminal of the second NMOS transistor MN2, and the first and second NMOS transistors MN1 and MN2 may be included in a current mirror circuit. One end of the second NMOS transistor MN2 may output a second current I2 which may be a mirror current obtained by mirroring the first current I1, and the other end of the second NMOS transistor MN2 may be connected to a second power supply node providing the second power supply voltage GND.

The magnitude of the second current I2 may be determined according to the magnitude of the first current I1. Since the magnitude of the first current I1 does not substantially change in relation to changing temperature, the magnitude of the second current I2 may also be maintained at a substantially constant level regardless of temperature. Thus, the second current I2 may be characterized by a substantially constant current.

Figure 2:
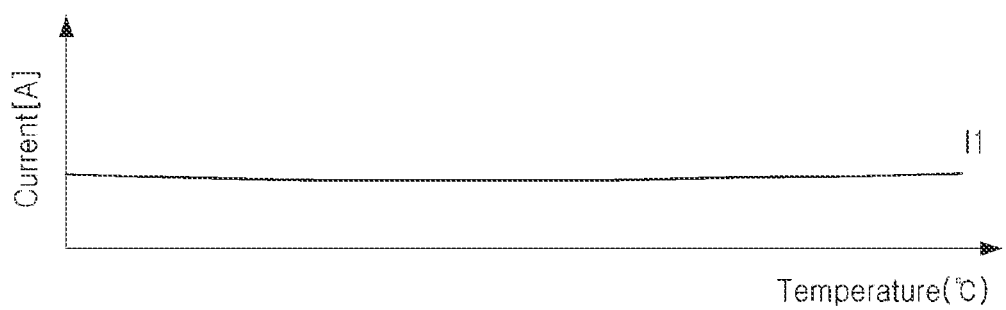
FIG. 2 is a graph further illustrating operation of the semiconductor device of FIG. 1.

FIG. 2 is a graph illustrating operation of the semiconductor device of FIG. 1.

Referring to FIGS. 1 and 2, the source terminal of the PMOS transistor MP may be connected to the resistor element R, and a resistance value of the resistor element R may increase as temperature increases. Accordingly, the magnitude of the source voltage of the PMOS transistor MP may decrease as temperature increases. In this regard, the magnitude of the source voltage applied to the source terminal of the PMOS transistor MP may be expressed as [VCC−I1*R].

Accordingly, the magnitude of the threshold voltage of the PMOS transistor MP may decrease as temperature increases. Since the voltage of the gate terminal of the PMOS transistor MP may be configured as the second power supply voltage GND and may maintained to be substantially constant, as the threshold voltage of the PMOS transistor MP decreases due to an increase in temperature, resistance of the PMOS transistor in a turned-ON state may decrease as temperature increases.

As temperature increases, the source voltage of the PMOS transistor MP may decrease and resistance of the PMOS transistor MP may decrease, such that changing of the magnitude of the first current I1 according to temperature may be reduced. In some embodiments, as illustrated in the graph of FIG. 2, the magnitude of the first current I1 may be maintained at a substantially constant level despite changes in temperature. Accordingly, the first current I1 exhibits constant current properties.

Figure 3:
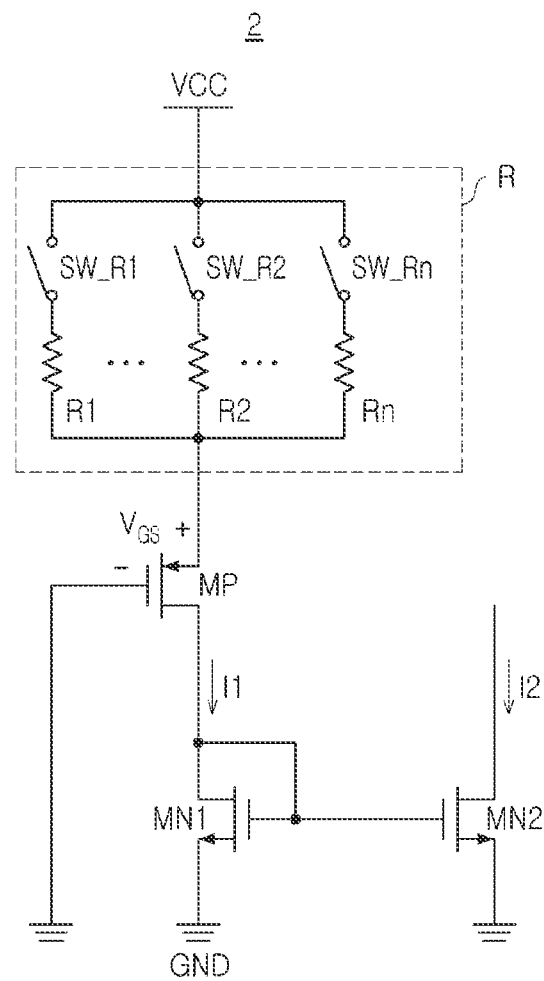
FIGS. 3, 4, 5, and 6 are respective circuit diagrams illustrating, in part, various semiconductor devices according to embodiments of the inventive concept.

FIG. 3 is a circuit diagram illustrating, in part, a semiconductor device 2 according to embodiments of the inventive concept.

Referring to FIG. 3, the semiconductor device 2 may include a current source providing a current which does not substantially change in relation to temperature. Here, the current source may include a resistor element R, a PMOS transistor MP, a diode-connected first NMOS transistor MN1, and a second NMOS transistor MN2. The resistor element R may include a plurality of unit resistor elements R1 to Rn and a plurality of unit switches SW_R1 to SW_Rn. In some embodiments, each of the plurality of unit resistor elements R1 to Rn may have the same resistance value. Alternately, at least one of the plurality of unit resistor elements R1 to Rn may have a different resistance value from another one of the plurality of unit resistor elements R1 to Rn.

Here, the configuration and operation of the PMOS transistor MP, the first NMOS transistor MN1, and the second NMOS transistor MN2 may be substantially similar to those described in relation to FIG. 1.

The plurality of unit resistor elements R1 to Rn may be connected in parallel, wherein each of the plurality of unit resistor elements R1 to Rn may be respectively connected to one of the plurality of unit switches SW_R1 to SW_Rn in order to individually turn the same ON or OFF (hereafter, ON/OFF). Thus, in some embodiments, one end of each of the plurality of unit resistor elements R1 to Rn may be connected to a first power supply node providing the first power supply voltage VCC through a unit switch SW_R1 to SW_Rn, and the other end may be connected to one end of the PMOS transistor MP (e.g., to a source terminal of the PMOS transistor MP).

In the illustrated example of FIG. 3, the magnitude of the first current I1 may be determined according to the resistance value of the resistor element R, which may be determined according to the turning ON/OFF of the plurality of unit switches SW_R1 to SW_Rn. For example, as the resistance value of the resistor element R increases in response to the selective turning ON/OFF of the plurality of unit switches SW_R1 to SW_Rn, the magnitude of the first current I1 may decrease, and as the resistance value of the resistor element R decrease, the magnitude of the first current I1 may increase.

During the design and/or manufacture the semiconductor device 2, the magnitude of the first current I1 provided by the PMOS transistor MP may be controlled such that it does not change in relation to temperature by controlling the turned ON/OFF of the unit switches SW_R1 to SW_Rn respectively connected to the plurality of unit resistor elements R1 to Rn. Thus, in some embodiments, as the number of turned-ON unit switches increases, the number of unit resistor elements connected between the first power supply node and the PMOS transistor MP among the plurality of unit resistor elements R1 to Rn may increase, such that the resistance value of the resistor element R may decrease.

Alternately or additionally, the resistance value of the resistor element R may be determined according to changes in the threshold voltage of the PMOS transistor MP in relation to changes in temperature. For example, as the threshold voltage for the PMOS transistor MP increases in response to changing temperature, the number of turned-ON unit switches among the plurality of unit switches SW_R1 to SW_Rn may be reduced, such that the resistance value of the resistor element R may be relatively large. It follows that as the threshold voltage change for the PMOS transistor MP according to the temperature change is small, the number of turned-ON unit switches among the plurality of unit switches SW_R1 to SW_Rn may increase such that the resistance value of the resistor element R may be determined to be relatively small.

That is, the degree of change in the magnitude of the threshold voltage of the PMOS transistor MP according to temperature change may vary across different embodiments of the inventive concept. For example, by controlling the turned ON/OFF state of the unit switches SW_R1-SW_Rn in response to the degree of change, the current provided by the current source may remain substantially constant.

Figure 4:
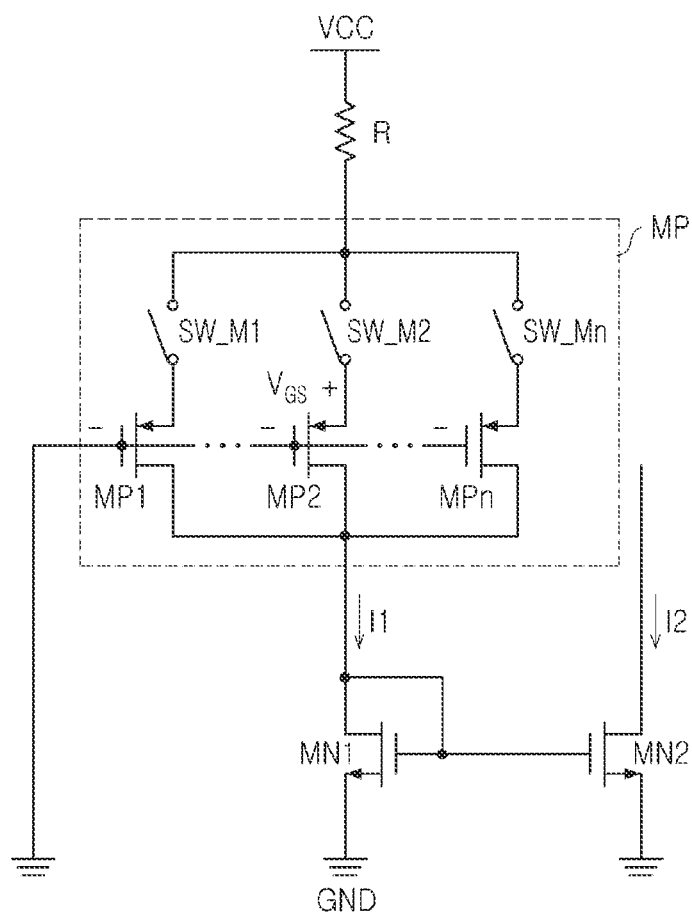

FIG. 4 is a circuit diagram illustrating, in part, a semiconductor device 3 according to embodiments of the inventive concept.

The semiconductor device 3 may include a current source providing an output current that is substantially constant in relation to temperature. The current source may include a resistor element R, a PMOS transistor MP, a diode-connected first NMOS transistor MN1, and a second NMOS transistor MN2. Here, however, the PMOS transistor MP may include a plurality of unit PMOS transistors MP1 to MPn and a plurality of unit switches SW_M1 to SW_Mn. In some embodiments, each of the plurality of unit PMOS transistors MP1 to MPn may have the same magnitude. Alternately, at least one of the plurality of unit PMOS transistors MP1 to MPn may have a different property (e.g., magnitude, size, threshold voltage, etc.) than another one of the plurality of unit PMOS transistors MP1 to MPn.

Here, the configuration and operation of the resistor element R, the first NMOS transistor MN1, and the second NMOS transistor MN2 may be substantially similar to those previously described in relation to FIG. 1.

The plurality of unit PMOS transistors MP1 to MPn may be connected in parallel, and each of the plurality of unit PMOS transistors MP1 to MPn may be respectively connected to one of a plurality of unit switches SW_M1 to SW_Mn in order to individually turn same ON/OFF. Thus, one end of each of the plurality of unit PMOS transistors MP1 to MPn may be connected the resistor R, and the other end may be connected to one end of the first NMOS transistor MN1. For example, one end of the PMOS transistor MP may be configured as a source terminal, and the other end may be configured as a drain terminal.

In some embodiments, the magnitude of the first current I1 may be determined according to a number of turned-ON unit switches among the plurality of unit switches SW_M1 to SW_Mn. That is, the magnitude of the first current I1 may be determined according to the number of PMOS transistors connected to the resistor element R from among the plurality of unit PMOS transistors MP1 to MPn. For example, as the number of unit PMOS transistors connected to the resistor R increases, the magnitude of the first current I1 may increase. During the design and/or manufacture of the semiconductor device 3, the magnitude of the first current I1 may be maintained constant in the face of changing temperature by controlling the ON/OFF state of each of the plurality of unit switches SW_M1 to SW_Mn connected to each of the plurality of PMOS transistors MP1 to MPn. For example, as the number of turned-ON unit switches among the plurality of unit switches SW_M1 to SW_Mn increases, the resistance value between the resistor element R and the first NMOS transistor MN1 may be reduced, and the magnitude of the first current I1 may increase.

In some embodiments, the ON/OFF state of each of the plurality of unit switches SW_M1 to SW_Mn may be determined according to a resistance value of the resistor element R. For example, when the resistance value of the resistor element R is large, the number of turned-ON unit switches among the plurality of unit switches SW_M1 to SW_Mn may be reduced. However, when the resistance value of the resistor element R is small, the number of turned-ON unit switches among the plurality of unit switches SW_M1 to SW_Mn may increase.

Figure 5:
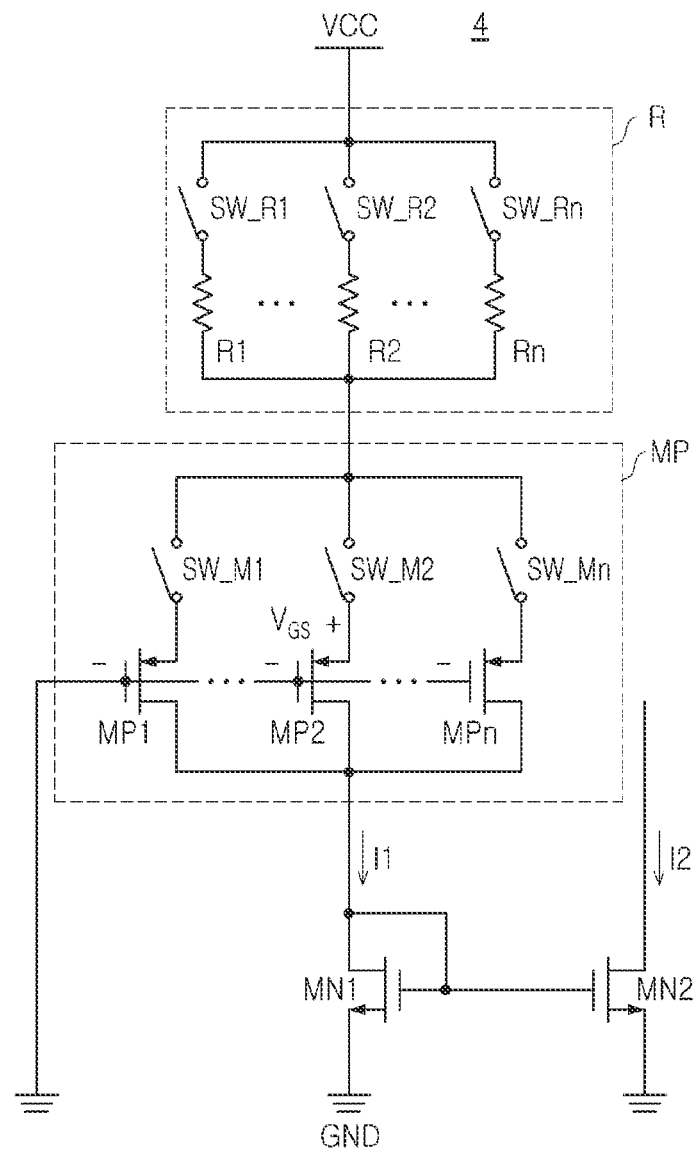

FIG. 5 is a circuit diagram illustrating, in part, a semiconductor device 4 according to embodiments of the inventive concept.

The semiconductor device 4 may include a current source providing a constant output current regardless of temperature. Here, the current source may include a resistor element R, a PMOS transistor MP, a diode-connected first NMOS transistor MN1, and a second NMOS transistor MN2.

The resistor element R may include a plurality of unit resistor elements R1 to Rn and a plurality of unit switches SW_R1 to SW_Rn. In some embodiments, the plurality of unit resistor elements R1 to Rn may have substantially the same resistance value. Alternately, at least one of the unit resistor elements R1 to Rn may have different resistance value than another one of the unit resistor elements R1 to Rn.

The PMOS transistor MP may include a plurality of unit PMOS transistors MP1 to MPn and a plurality of unit switches SW_M1 to SW_Mn. In some embodiments, the plurality of unit PMOS transistors MP1 to MPn may have the same property (e.g., magnitude, size, threshold volage etc.). Alternately, at least one of the plurality of unit PMOS transistors MP1 to MPn may have different property than another one of the plurality of unit PMOS transistors MP1 to MPn.

The first NMOS transistor MN1 and the second NMOS transistor MN2 may form a current mirror circuit. Here, the configuration and operation of the current mirror circuit may be substantially similar to that previously described in relation to FIG. 1, and the configuration and operation of the plurality of unit resistor elements R1 to Rn and the plurality of unit switches SW_R1 to SW_Rn may be substantially similar that that previously described in relation to FIG. 3. Further, the configuration and operation of the plurality of unit PMOS transistors MP1 to MPn and the plurality of unit switches SW_M1 to SW_Mn may be substantially similar to that previously described in relation to FIG. 4.

For example, during the design and/or manufacture of the semiconductor device 4, the magnitude of the first current I1 may be controlled to be constant over a defined temperature range by controlling ON/OFF state of the plurality of unit switches SW_R1 to SW_Rn connected to the resistor elements R1 to Rn and a plurality of unit switches SW_M1 to SW_Mn connected to the plurality of unit PMOS transistors MP1 to MPn, respectively. Alternately or additionally, the state of each of the unit switches SW_R1 to SW_Rn connected to the plurality of unit resistor elements R1 to Rn may be controlled according to the ON/OFF state of each of the unit switches SW_R1 to SW_Rn connected to the plurality of unit PMOS transistors MP1 to MPn, such that a change in the resistance value of the resistor element R in response to a temperature change may offset (or cancel out) a change in the resistance value of the PMOS transistor MP in response to the temperature change.

Figure 6:
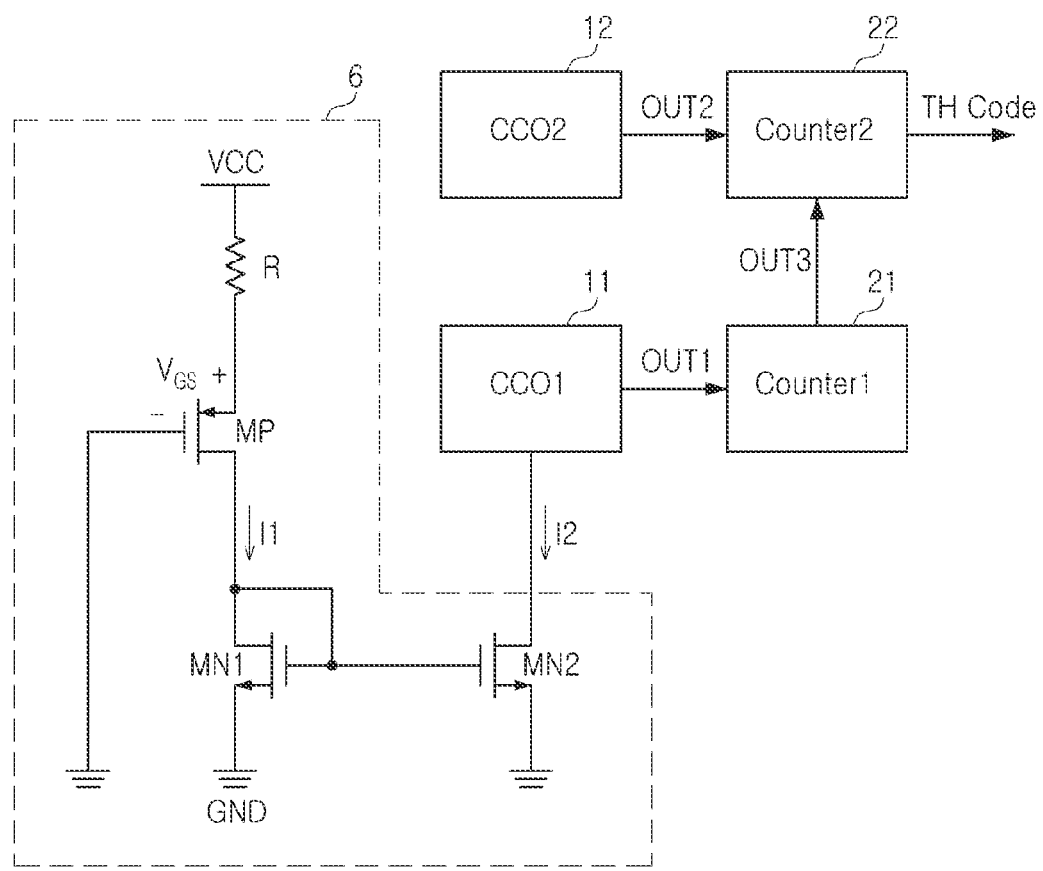

FIG. 6 is a circuit diagram illustrating, in part, a semiconductor device 5 according to embodiments of the inventive concept.

Referring to FIG. 6, the semiconductor device 5 may include a current source 6, a first current-controlled oscillator 11, and a second current-controlled oscillator 12, a first counter 21, and a second counter 22. The current source 6 may include a resistor element R, a PMOS transistor MP, a diode-connected first NMOS transistor MN1, and a second NMOS transistor MN2.

In some embodiments, the current source 6 of FIG. 6 may be substantially similar to one of the respective current sources previously described in relation to FIGS. 1, 2, 3, 4 and 5. That is, the configuration and operation of the current source 6 may be substantially similar to that of the current sources previously described in relation to FIGS. 1, 2, 3, 4 and 5.

Referring to FIG. 6, the first current-controlled oscillator (CCO1) 11 may receive the second current I2 provided by the current source 6 and provide a first signal OUT1. For example, the magnitude of the first current I1 provided to the first NMOS transistor MN1 in the current source 6 may be substantially constant regardless of temperature according to the resistor element R having a resistance value that increases as temperature increases, and the PMOS transistor MP having a resistance value that decreases as temperature increases. Thus, a change in magnitude of the first current I1 caused by temperature change may be reduced, and the first current I1 may exhibit a substantially constant output current.

It follows that the magnitude of the second current I2 may also be maintained at substantially constant regardless of temperature changes. Since the second current I2 provided by the current source 6 does not substantially change over temperature, the first signal OUT1 output by the first current-controlled oscillator 11 may also exhibit a substantially constant output current regardless of temperature. For example, the first signal OUT1 may be configured as a clock signal having a first frequency that may be constantly maintained regardless of temperature.

A second current-controlled oscillator (CCO2) 12 may provide a second signal OUT2 as a clock signal having a second frequency different from that of the first signal OUT1, wherein the second frequency of the second signal OUT2 may change according to temperature. For example, the second frequency may increase as temperature increases.

A first counter (Counter1) 21 may receive the first signal OUT1 and may output a third signal OUT3 to a second counter (Counter2) 22. For example, the first counter 21 may be configured as a counter circuit, and may count a rising edge and/or a falling edge of the first signal OUT1 to determine a number (e.g., M, where 'M' is a natural number) of times (e.g., in relation to a single cycle) that the first signal OUT1 is received from the first current-controlled oscillator 11. Thus, when the first counter 21 receives the first signal OUT1 for a predetermined reference number of times, the first counter 21 may output the third signal OUT3 to the second counter 22. For example, the third signal OUT3 may be configured as an enable signal for the second counter 22 and defining a corresponding operative period. Since the first signal OUT1 has a substantially constant frequency, the first counter 21 may also output the third signal OUT3 in a substantially constant frequency, albeit a frequency that may be variously defined in relation to the first output signal OUT1.

The second counter 22 may receive the second signal OUT2 a number (e.g., N, wherein 'N' is a natural number) of times during an enable period associated with the third signal OUT3. As temperature increases, the frequency of the second signal OUT2 may increase, and the number of times the second counter 22 receives the second signal OUT2 during the enable period may increase accordingly. Since the third signal OUT3 may be substantially constant regardless of temperature, the enable period in which the second counter 22 receives the second signal OUT2 from the second current-controlled oscillator 12 may also be substantially constant regardless of temperature.

Accordingly, the second counter 22 may output a temperature code TH Code corresponding to the number of cycles included in the second signal OUT2, as received from the second current-controlled oscillator 12 during the enable period associated with the third signal OUT3. For example, as temperature increases, the number of cycles included in the second signal OUT2 received by the second counter 22 during the enable period may increase, and the temperature code TH Code may increase proportionally.

In effect therefore, the circuit of FIG. 6 may be understood as a temperature sensor providing a temperature code TH Code. And since the temperature code TH Code changes with temperature change, the semiconductor device 5 may sense temperature changes in response to the temperature code TH Code.

Further in this regard, the temperature code TH Code may be used to control various operations performed by the semiconductor device 5. For example, assuming that the semiconductor device 5 is a memory device including memory cells, the magnitude of a bias voltage applied to the memory cells during a data access operation (e.g., a program operation, a read operation, or an erase operation) performed by the memory device may be differently determined according to the temperature code TH Code.

Figure 7:
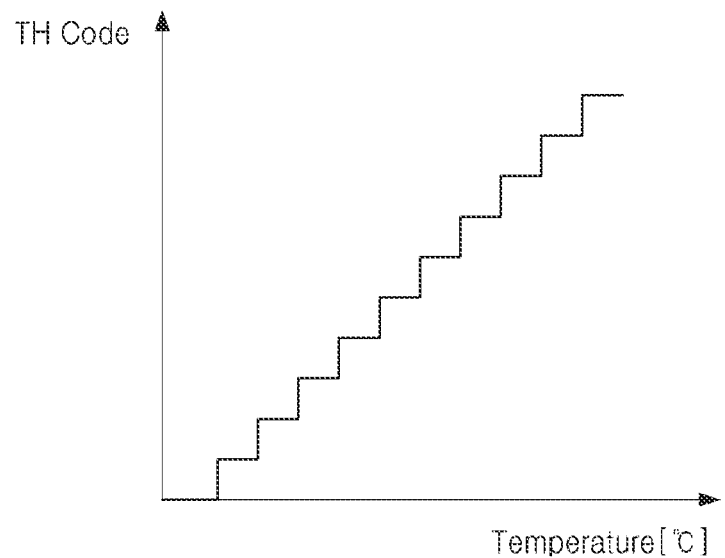
FIG. 7 is a graph further illustrating operation of the semiconductor device of FIG. 6.

FIG. 7 is a graph further illustrating operation of the semiconductor device of FIG. 6.

Here, the temperature code TH Code indicated in the graph of FIG. 7 may correspond with a signal provided by the second counter 22 of FIG. 6. Referring to FIGS. 6 and 7, as temperature increases, the temperature code TH Code may also increase. In some embodiments, the temperature code TH Code in each one of a number of temperature sections may have the same value, and the temperature code TH Code may increase by a predetermined unit (e.g., a step increment) whenever temperature increases outside (or beyond) of a current temperature section.

However in this regard, those skilled in the art will appreciate that temperature code information and functionality may be variously implemented. For example, as temperature increases, the temperature code TH Code may decrease.

Figure 8:
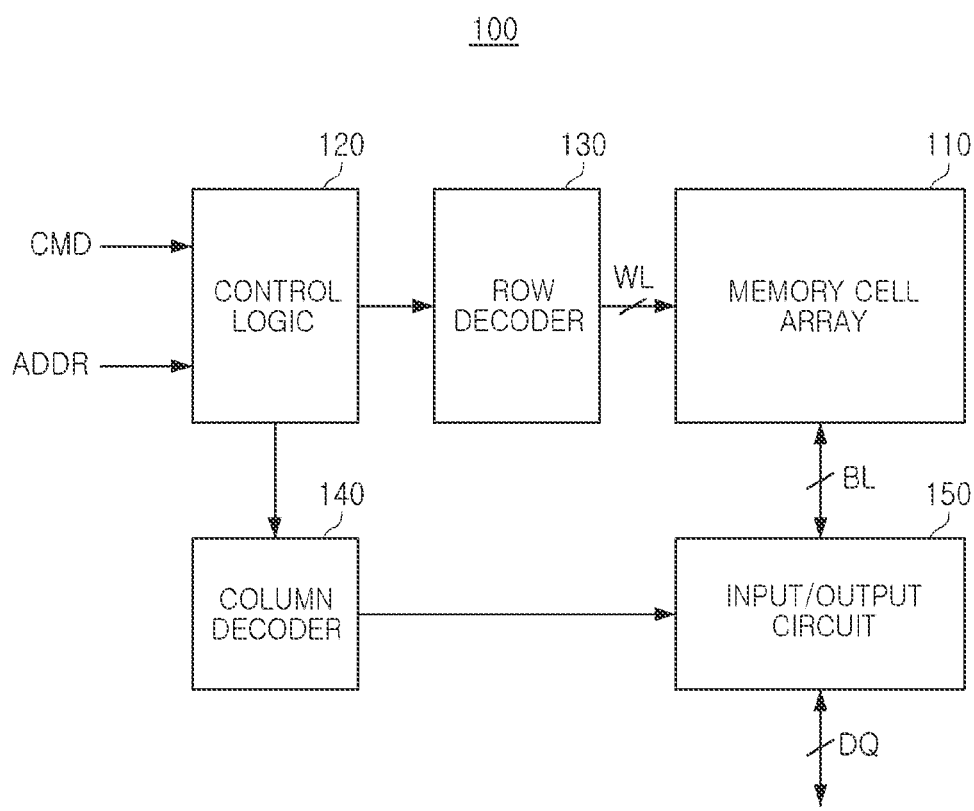
FIG. 8 is a block diagram illustrating a semiconductor device according to embodiments of the inventive concept.

FIG. 8 is a block diagram illustrating a semiconductor device according to embodiments of the inventive concept.

Referring to FIG. 8, the semiconductor device 100 may be implemented as a storage device. That is, the semiconductor device 100 may be implemented as a random access memory (RAM) device such as a dynamic random access memory (DRAM), a synchronous DRAM (SDRAM), a static RAM (SRAM), a double date rate SDRAM (DDR SDRAM), a DDR2 SDRAM, aDDR3 SDRAM, a phase-change RAM (PRAM), magnetic RAM (MRAM) or a resistive RAM (RRAM). The semiconductor device 100 may store data received through a data signal DQ or may output data to the data signal DQ in response to an address signal ADDR and a control command signal CMD received from an external host (e.g., a central processing unit (CPU), an application processor (AP), a system-on-chip (SoC)). The semiconductor device 100 may include a memory cell array 110, a control logic 120, a row decoder 130, a column decoder 140, and an input/output circuit 150.

In the semiconductor device 100, the control logic 120, the row decoder 130, the column decoder 140, and the input/output circuit 150 may be disposed in the peripheral circuit region, and the memory cell array 110 may be disposed in the cell region. However, the configuration and operation of the cell region and the peripheral circuit region may vary by the design, type functionality of the semiconductor device 100.

The memory cell array 110 may include a plurality of memory cells, and the plurality of memory cells be connected to a row decoder 130 and an input/output circuit 150 through a plurality of word lines WL and a plurality of bit lines BL. Each of the plurality of memory cells may be disposed at a point at which the plurality of word lines WL and the plurality of bit lines BL intersect with each other. The plurality of memory cells may be arranged in a matrix form in the memory cell array 110, and each of the plurality of memory cells may include at least one memory device for storing data. For example, when the semiconductor device 100 is configured as a DRAM, each of the plurality of memory cells may include a switch device and a cell capacitor. When the semiconductor device 100 is configured as a NAND memory device, each of the plurality of memory cells may include a charge storage layer in which charges are trapped.

The control logic 120 may receive an address signal ADDR and a control command signal CMD from an external host. The address signal ADDR may include a row address indicating a row in the memory cell array 110 and a column address indicating a column in the memory cell array 110. For example, the row decoder 130 may select at least one of the plurality of word lines WL with reference to the row address, and the column decoder 140 may select at least one of the plurality of bit lines BL with reference to the column address. The input/output circuit 150 may output the data signal DQ read from the memory cell array 110.

Here, it should be noted that the operative properties of various components included in the semiconductor device 100 (e.g., the memory cells of the memory cell array 110) may be affected by temperature. Accordingly, it is highly desirable to detect temperature changes and operate the semiconductor device 100 in response thereto. Accordingly, the semiconductor device 100 of FIG. 8 may include (e.g., in the peripheral region) one or more current source(s)

providing a substantially constant output current regardless temperature change consistent with the embodiments of FIGS. 1, 2, 3, 4, 5 and 6.

Thus, in some embodiments, a current source, a current-controlled oscillator, and a counter, and a temperature sensor providing a temperature code changing in accordance with temperature may be disposed in the peripheral circuit region of the semiconductor device 100. In some embodiments, at least one of the control logic 120, the row decoder 130, the column decoder 140, and the input/output circuit 150 included in the peripheral circuit region may differently determine a bias voltage magnitude, as applied to the memory cell array 110, depending on the temperature code TH code provided by a temperature sensor like the one described in relation to FIG. 6.

Figure 9:
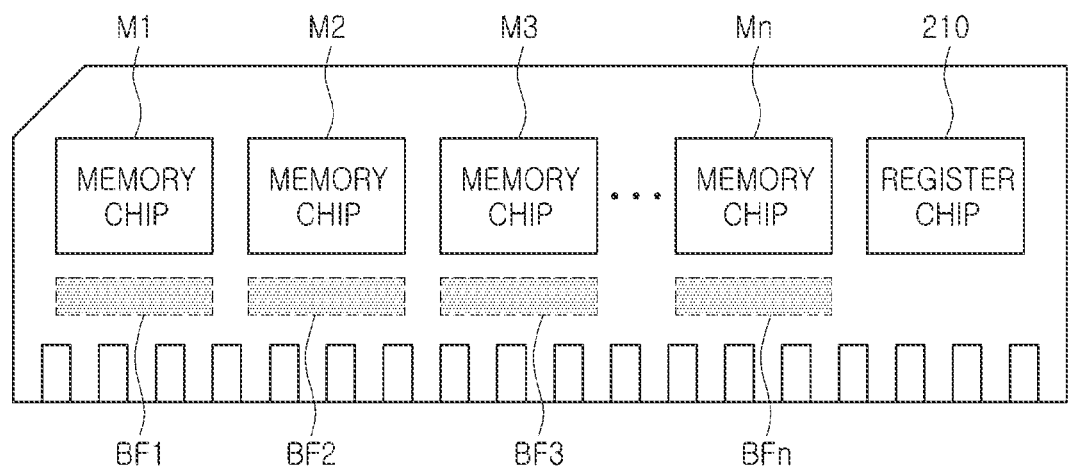
FIG. 9 is a block diagram illustrating a semiconductor package including a semiconductor device according to embodiments of the inventive concept.

FIG. 9 is a block diagram illustrating a semiconductor package 200 including a semiconductor device according to embodiments of the inventive concept.

Referring to FIG. 9, the semiconductor package 200 may include a plurality of memory chips M1 to Mn, a register chip 210, buffers BF1 to BFn, and the like. Each of the plurality of memory chips M1 to Mn may include a bank array, a row decoder, a sense amplifier circuit, a column decoder, and a control logic, and the bank array may include a plurality of memory cells.

The register chip 210 may receive a command signal and an address signal from an external host, and may control the plurality of memory chips M1 to Mn according to the command signal and the address signal. The register chip 210 may select at least one of the plurality of memory chips M1 to Mn with reference to the address signal, and may control at least one of the plurality of memory chips M1 to Mn to store data or to output data according to the command signal.

In some embodiments, a plurality of buffer chips BF1 to BFn may be respectively allocated to the plurality of memory chips M1 to Mn. The plurality of buffer chips BF1 to BFn may be connected to paths through which the plurality of memory chips M1-Mn input/output data, and may communicate (e.g., transmit and/or receive) data between the semiconductor package 200 and an external host.

Each of the plurality of memory chips M1 to Mn may include a current source according to at least one of the aforementioned example embodiments described in relation to FIGS. 1, 2, 3, 4, 5 and 6. For example, properties of the plurality of memory cells included in the bank array in each of the plurality of memory chips M1 to Mn may vary with temperature. For example, by using a current source providing a substantially constant current regardless of temperature change, a temperature code corresponding to the current temperature may be accurately generated, and a plurality of memory cells may be controlled according to the temperature code TH Code. For example, a magnitude of a bias voltage input to a plurality of memory cells in a program operation, a read operation, and a refresh operation of each of the plurality of memory chips M1 to Mn may be determined differently according to a temperature sensed by the temperature sensor.

Figure 10:
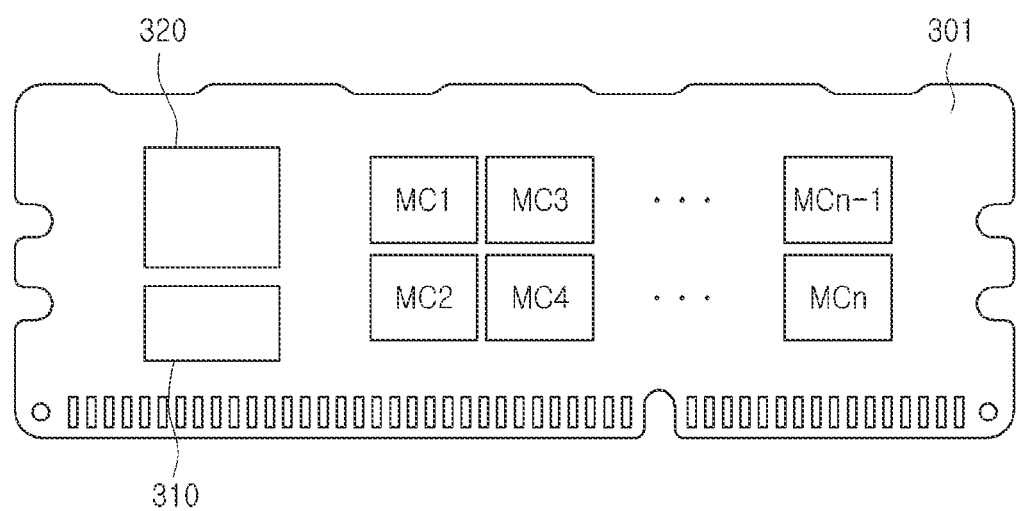
FIG. 10 is a block diagram illustrating a storage device including a semiconductor device according to embodiments of the inventive concept.

FIG. 10 is a block diagram illustrating a storage device 300 including a semiconductor device according to embodiments of the inventive concept.

Referring to FIG. 10, the storage device 300 may include a plurality of nonvolatile memory devices MC1 to MCn, a power management device 310, and a controller 320. Each of the plurality of nonvolatile memory devices MC1 to MCn may include a cell region in which the memory cell array is disposed, and a peripheral circuit region for controlling the memory cell array. A plurality of memory cells may be disposed in a three-dimensional structure in the memory cell array of the cell region, and the peripheral circuit region may include a control logic, a row decoder, a page buffer, and an input/output circuit.

The power management device 310, the controller 320, and the nonvolatile memory devices MC1-MCn may be connected by wiring patterns formed on the substrate 301. In example embodiments, the storage device 300 may communicate with an external host according to one of an M-Phy for universal serial bus (USB), peripheral component interconnect express (PCI-Express), serial advanced technology attachment (SATA), universal flash storage (UFS), or the like. For example, the storage device 300 according to the example embodiment illustrated in FIG. 10 may have a form factor such as a 2.5-inch disk drive, and may communicate with other external devices according to the SATA protocol.

The storage device 300 may operate according to an external power supply voltage and a control command transmitted from an external host. The power management device 310 of the storage device 300 may be configured as a power management integrated circuit (PMIC) which may generate internal power supply voltages necessary for operation of the controller 320 and the plurality of nonvolatile memory devices MC1-MCn, using an external power supply voltage supplied from an external host.

The controller 320 may write data to the plurality of non-volatile memory devices MC1 to MCn or may read data from the plurality of non-volatile memory devices MC1 to MCn, and may exchange data with an external host. Each of the plurality of non-volatile memory devices MC1 to MCn may be implemented as a NAND memory device, and the controller 320 may include a NAND controller and a memory interface for controlling the plurality of non-volatile memory devices MC1 to MCn. In example embodiments, at least one of the plurality of non-volatile memory devices MC1 to MCn may further include an interface chip mediating communication with the controller 320.

At least one of the power management device 310, the controller 320, and the plurality of non-volatile memory devices MC1-MCn may include a current source according to at least one of the aforementioned example embodiments described with reference to FIGS. 1, 2, 3, 4, 5 and 6. Similarly to the example described above with reference to FIG. 9, properties of the plurality of memory cells included in the plurality of nonvolatile memory devices MC1 to MCn may vary with temperature. In an example embodiment, by using a current source providing a substantially constant current regardless of a temperature change, a temperature code indicating a temperature change may be generated, and the plurality of non-volatile memory devices MC1 to MCn may operate according to the temperature code TH Code. For example, a magnitude of a bias voltage input to the memory cell array in a program operation, a read operation, and an erase operation of the plurality of non-volatile memory devices MC1 to MCn may be determined differently according to a temperature sensed by the temperature sensor.

According to the aforementioned example embodiments, by applying a ground voltage to the control terminal of the PMOS transistor, a current source may provide a constant current regardless of temperature change without recourse to a bandgap reference circuit. Accordingly, the bandgap reference circuit may be omitted, such that integration density of the semiconductor device may be improved. Further, by implementing a current source providing a constant current regardless of temperature change, overall performance of the semiconductor device may be improved.

While the example embodiments have been illustrated and described above, it will be configured as apparent to those skilled in the art that modifications and variations could be made without departing from the scope of the inventive concept as defined by the appended claims.

What is claimed is:

1. A semiconductor device, comprising:
a resistor element connected to a first power supply node providing a first power supply voltage having a first magnitude;
a PMOS transistor element comprising a PMOS transistor having:
a gate terminal connected to a second power supply node to receive a second power supply voltage, wherein the second power supply node is at the second power supply voltage, and wherein the second power supply voltage has a second magnitude less than the first magnitude,
a source terminal connected to the resistor element, and
a drain terminal providing a first current; and
a first NMOS transistor configured as a diode-connected transistor, and connected between the drain terminal of the PMOS transistor and a node that is at the second power supply voltage.

2. The semiconductor device of claim 1, wherein a resistance value of the resistor element varies in proportion to temperature, and a threshold voltage of the PMOS transistor varies inversely in proportion to temperature.

3. The semiconductor device of claim 1, wherein the resistor element includes a plurality of unit resistor elements connected in parallel.

4. The semiconductor device of claim 3, wherein the resistor element further includes a plurality of unit switches respectively connected to the plurality of unit resistor elements.

5. The semiconductor device of claim 1, wherein the PMOS transistor element comprises a plurality of unit PMOS transistors connected in parallel between the resistor element and the first NMOS transistor, wherein the plurality of unit PMOS transistors comprises the PMOS transistor.

6. The semiconductor device of claim 5, wherein the PMOS transistor element further includes a plurality of unit switches respectively connected to the plurality of unit PMOS transistors.

7. The semiconductor device of claim 1, wherein the resistor element includes a plurality of unit resistor elements connected in parallel, and
the PMOS transistor element includes a plurality of unit PMOS transistors connected in parallel, the plurality of unit PMOS transistors comprising the PMOS transistor.

8. The semiconductor device of claim 7, wherein the resistor element further includes a first plurality of unit switches respectively connected to the plurality of unit resistor elements, and
wherein the PMOS transistor element further includes a second plurality of unit switches respectively connected to the plurality of unit PMOS transistors.

9. The semiconductor device of claim 1, further comprising:
a second NMOS transistor,
wherein a gate terminal of the first NMOS transistor is connected to a gate terminal of the second NMOS transistor, and the second NMOS transistor is configured to provide a second current mirroring the first current provided by the PMOS transistor.

10. The semiconductor device of claim 9, further comprising:
a first current-controlled oscillator configured to receive the second current and provide a first signal having a first frequency that remains constant in response to temperature change.

11. The semiconductor device of claim 10, further comprising:
a first counter configured to receive the first signal and provide a third signal that remains constant in response to temperature change.

12. The semiconductor device of claim 11, further comprising:
a second current-controlled oscillator and a second counter,
wherein the second current-controlled oscillator is configured to provide a second signal having a second frequency that varies with temperature change,
the second counter is configured to provide a temperature code in response to the second signal and the third signal, and
the temperature code varies with temperature change.

13. The semiconductor device of claim 12, further comprising:
a temperature sensor configured to sense temperature in response to the temperature code.

14. A semiconductor device, comprising:
a cell region including a plurality of memory cells; and
a peripheral circuit region including peripheral circuits driving the cell region,
wherein the peripheral circuit region further includes a current source including a resistor element, a PMOS transistor, and a diode-connected first NMOS transistor,
wherein a control terminal of the PMOS transistor receives a ground voltage,
an input terminal of the PMOS transistor receives a power supply voltage higher than the ground voltage through the resistor element, and
an output terminal of the PMOS transistor provides a current to the first NMOS transistor.

15. The semiconductor device of claim 14, wherein a resistance value of the resistor element varies in proportion to temperature, and a threshold voltage of the PMOS transistor varies inversely in proportional to temperature, and
the current source is configured to provide a constant current.

16. The semiconductor device of claim 15, wherein the current source includes a second NMOS transistor configured to form a current mirror circuit with the first NMOS transistor, such that the second NMOS transistor provides a mirror current generated by mirroring the current provided by the PMOS transistor.

17. The semiconductor device of claim 16, further comprising:
a first current-controlled oscillator configured to provide a first signal having a first frequency based on the current mirror circuit;
a second current-controlled oscillator configured to provide a second signal having a second frequency that varies according to temperature; and
a counter configured to provide a temperature code in response to the first signal and the second signal.

18. The semiconductor device of claim 17, wherein the temperature code increases as temperature increases, and
the semiconductor device further comprises a temperature sensor configured to sense temperature in response to the temperature code.

19. A semiconductor device, comprising:
a current source configured to provide a constant current regardless of temperature change; and
a temperature sensor configured to sense temperature in response to the constant current,
wherein the current source includes:
  a resistor element having a resistance value that varies in proportion to temperature;
  a PMOS transistor having a threshold voltage that varies inversely in proportion to temperature and including a control terminal configured to receive a ground voltage; and
  a current mirror circuit configured to mirror a current provided by the PMOS transistor.

20. The semiconductor device of claim 19, wherein the temperature sensor includes a current-controlled oscillator configured to receive the constant current and generate an output signal, and
a counter configured to receive the output signal generated by the current-controlled oscillator and provide a temperature code.

* * * * *